United States Patent
Iiyama (10) Patent No.: US 9,788,424 B2
(45) Date of Patent: Oct. 10, 2017

(54) WIRING SUBSTRATE, ELECTRONIC DEVICE, AND ELECTRONIC MODULE

(75) Inventor: Masatsugu Iiyama, Satsumasendai (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 70 days.

(21) Appl. No.: 14/234,903

(22) PCT Filed: Jul. 25, 2012

(86) PCT No.: PCT/JP2012/068868
§ 371 (c)(1),
(2), (4) Date: Jan. 24, 2014

(87) PCT Pub. No.: WO2013/015327
PCT Pub. Date: Jan. 31, 2013

(65) Prior Publication Data
US 2014/0177179 A1    Jun. 26, 2014

(30) Foreign Application Priority Data
Jul. 25, 2011 (JP) .................................. 2011-162252

(51) Int. Cl.
*H05K 1/11*      (2006.01)
*H05K 3/34*      (2006.01)
(Continued)

(52) U.S. Cl.
CPC .............. *H05K 1/111* (2013.01); *H01L 23/13* (2013.01); *H01L 23/49805* (2013.01); *H05K 3/3442* (2013.01); *H01L 2224/48227* (2013.01); *H01L 2224/49175* (2013.01); *H05K 2201/09181* (2013.01); *H05K 2201/10727* (2013.01); *Y02P 70/613* (2015.11)

(58) Field of Classification Search
CPC . H05K 2201/09181; H05K 2201/0919; H05K 1/11; H05K 3/3442
USPC ................... 361/748, 767; 174/255; 257/774
See application file for complete search history.

(56) References Cited

U.S. PATENT DOCUMENTS

| | | | |
|---|---|---|---|
| 7,507,914 B2 * | 3/2009 | Levine | H01L 21/485 174/260 |
| 8,410,599 B2 * | 4/2013 | Perng | H01L 23/481 257/401 |
| 2003/0155656 A1 * | 8/2003 | Chiu | H01L 23/49827 257/774 |

FOREIGN PATENT DOCUMENTS

| | | | |
|---|---|---|---|
| DE | 10224057 A1 * | 1/2004 | ............. H05K 3/403 |
| JP | 05183066 A | 7/1993 | |

(Continued)

OTHER PUBLICATIONS

International Search Report, PCT/JP2012/068868, Aug. 28, 2012, 2 pp.

*Primary Examiner* — Courtney Smith
*Assistant Examiner* — Jessey R Ervin
(74) *Attorney, Agent, or Firm* — Volpe and Koenig, P.C.

(57) ABSTRACT

A wiring substrate comprises an insulating substrate and an external electrode on the insulating substrate. The insulating substrate comprises a lateral surface comprising a cutout. The cutout extends to a lower surface of the insulating substrate. The external electrode extends from an inner surface of the cutout to the lower surface of the insulating substrate. The insulating substrate comprises a protrusion at a lower end portion of the inner surface of the cutout. The protrusion protrudes from the inner surface of the cutout toward the lateral surface of the insulating substrate.

9 Claims, 6 Drawing Sheets

(51) Int. Cl.
*H01L 23/13* (2006.01)
*H01L 23/498* (2006.01)

(56) References Cited

FOREIGN PATENT DOCUMENTS

| | | |
|---|---|---|
| JP | 2002093932 A | 3/2002 |
| JP | 2003218265 A | 7/2003 |
| JP | 2004179338 A | 6/2004 |
| JP | 2006066424 A | 3/2006 |
| JP | 2006173389 A | 6/2006 |
| JP | 2006185953 A | 7/2006 |

* cited by examiner

WIRING SUBSTRATE, ELECTRONIC DEVICE, AND ELECTRONIC MODULE

FIELD OF INVENTION

The present invention relates to a wiring substrate to which, for example, an electronic component is mounted, and also relates to an electronic device and an electronic module each using the wiring substrate.

BACKGROUND

Hitherto, in general wiring substrates used for mounting electronic components such as a semiconductor element, a sensor element, a capacity element, or a piezoelectric oscillator, a mounting portion for the electronic component is provided in a principal surface (usually an upper surface) of an insulating substrate having a rectangular parallelepiped shape, for example, and a wiring conductor is disposed from a lateral surface to a lower surface of the insulating substrate. When an electronic device including the wiring substrate is joined to a mount board with a brazing material, the wiring conductor serves as an external electrode portion.

CITATION LIST

Patent Literature

PTL 1: Japanese Unexamined Patent Application Publication No. 5-183066

SUMMARY

Technical Problem

Recently, a size of the external electrode portion in the wiring substrate has been reduced with downsizing of electronic devices. Such a tendency has led to reduction of the strength of joining of the wiring substrate to the mount board by the brazing material, and to reduction of mounting reliability of the electronic device including the wiring substrate.

Solution to Problem

According to one aspect, the present invention provides a wiring substrate comprising an insulating substrate and an external electrode on the insulating substrate. The insulating substrate comprises a lateral surface comprising a cutout. The cutout extends to a lower surface of the insulating substrate. The external electrode extends from an inner surface of the cutout to the lower surface of the insulating substrate. The insulating substrate comprises a protrusion at a lower end portion of the inner surface of the cutout. The protrusion protrudes from the inner surface of the cutout toward the lateral surface of the insulating substrate.

According to another aspect, the present invention provides an electronic device including the wiring substrate described above, and an electronic component mounted to the wiring substrate.

According to still another aspect, the present invention provides an electronic module including the electronic device described above, and a mount board to which the electronic device is joined with a brazing material. The brazing material is placed on an upper surface of the protrusion.

Advantageous Effects of Invention

In the wiring substrate according to the one aspect of the present invention, since the lower end portion of the inner surface of the cutout protrudes toward the inner side of the cutout, the brazing material can easily stay inside the cutout when the electronic device including the wiring substrate is joined to the mount board by employing the brazing material. Therefore, the wiring substrate according to the one aspect of the present invention can realize an electronic device having improved mounting reliability.

In the electronic device according to the other aspect of the present invention, mounting reliability is improved because the electronic device includes the wiring substrate described above.

In the electronic module according to the still other aspect of the present invention, since the electronic module includes the electronic device described above and the brazing material is placed on the upper surface of the protruded portion of the inner surface of the cutout, the mounting reliability of the wiring substrate is improved.

BRIEF DESCRIPTION OF THE DRAWINGS

FIG. 6(a) is a top plan view of an electronic device according to a third embodiment of the present invention, FIG. 6(b) is an enlarged perspective view of a portion B of the electronic device illustrated in FIG. 5(a), and FIG. 5(c) is a sectional view, taken along a section line A-A, of an electronic module in which the electronic device illustrated in FIG. 5(a) is joined to the mount board.

DETAILED DESCRIPTION OF THE PREFERRED EMBODIMENTS

Several exemplary embodiments of the present invention will be described below with reference to the drawings.

First Embodiment

An electronic device according to a first embodiment of the present invention is described with reference to FIGS. 1 to 3. The electronic device according to this embodiment includes a wiring substrate 1 and an electronic component E mounted to the wiring substrate 1.

The wiring substrate 1 includes an insulating substrate 2 and an external electrode 4 on the insulating substrate 2.

The insulating substrate 2 includes a lateral surface including a cutout 3.

The insulating substrate 2 includes, on its upper surface, a mounting portion 1a to which the electronic component E, such as a semiconductor element, is mounted. The insulating substrate 2 is formed by vertically stacking a plurality of substantially rectangular insulating layers each of which is made of, for example, one of electric insulating ceramics such as an aluminum oxide-base sintered compact, a mullite-base sintered compact, a silicon carbide-base sintered compact, an aluminum nitride-base sintered compact, a silicon nitride-base sintered compact, and a glass ceramic-base sintered compact, or one of resins (plastics) such as an epoxy resin, a polyimide resin, an acrylic resin, a phenol resin, a polyester resin, and a fluorine contained resin including a tetrafluoroethylene resin.

When the insulating substrate 2 is made of an aluminum oxide-base sintered compact, for example, the insulating substrate 2 is fabricated through the steps of preparing slurry by adding sintering aids, such as silicon oxide, magnesium oxide, and calcium oxide, to powder of aluminum oxide, and by further adding and mixing an appropriate organic binder and solvent, etc., forming a green sheet (unfired sheet) from the slurry by the doctor blade method or the calender roll method, appropriately punching the green sheet into a substantially rectangular shape, stacking the plural green sheets one above another, and firing the stacked green sheets.

When the insulating substrate 2 is made of a resin, for example, the insulating substrate 2 can be formed by shaping the resin by, e.g., the transfer molding method or the injection molding method using a mold that is capable of shaping the resin into a predetermined shape. As an alternative, the insulating substrate 2 may be formed by impregnating a base material made of glass fibers with a resin, like a glass epoxy resin. In such a case, the insulating substrate 2 can be formed by impregnating the base material made of glass fibers with a precursor of an epoxy resin, and by thermosetting the precursor of the epoxy resin at a predetermined temperature.

In the insulating substrate 2 described above, an external electrode 4 is coated from an inner surface of the cutout 3 to a lower surface of the insulating substrate 2. Furthermore, a wiring conductor, including a penetration conductor such as a via hole conductor or a through-hole conductor, is formed by coating, for example, such that the wiring conductor extends from the upper surface of the insulating substrate 2 to which the electronic component E is mounted, to the external electrode 4 on the lateral surface. When the insulating substrate 2 is made of a ceramic, the external electrode 4 and the wiring conductor are each made of metallized powder using, e.g., tungsten (W), molybdenum (Mo), manganese (Mn), silver (Ag), or copper (Cu). The external electrode 4 and the wiring conductor are each formed at a predetermined position on the insulating substrate 2 by printing a conductive paste for the external electrode 4 and the wiring conductor on a ceramic green sheet for the insulating substrate 2 in a predetermined shape by the screen printing method, for example, and by firing the printed conductive paste at the same time as the ceramic green sheet. Of internal conductors, a penetration conductor penetrating through the ceramic green sheet in the direction of thickness thereof may be formed by printing the conductive paste such that the conductive paste fills a through-hole in the ceramic green sheet. The above-mentioned conductive paste is prepared by adding an appropriate solvent and binder to metal powder of, e.g., tungsten (W), molybdenum (Mo), manganese (Mn), silver (Ag), or copper (Cu), and then kneading the mixture, to thereby adjust viscosity of the mixture to an appropriate value. The conductive paste may additionally contain glass or ceramics with intent to increase the strength of joining to the insulating substrate 2.

When the insulating substrate 2 is made of a resin, the external electrode 4 and the wiring conductor are each made of a metallic material, e.g., copper, gold, aluminum, nickel, chromium, molybdenum, titanium, or an alloy of those elements. In this case, the external electrode 4 and the wiring conductor are each formed, for example, by transferring a copper foil, which is processed into a shape of the wiring conductor, to a resin sheet made of a glass epoxy resin, by stacking plural resin sheets to each of which the copper foil has been transferred, and by bonding the resin sheets together with an adhesive. Of internal conductors, a penetration conductor penetrating through the resin sheet in the direction of thickness thereof may be formed by plating or printing of the conductive paste to form a coating over an inner surface of the through-hole or to fill the through-hole. As an alternative, the external electrode 4 and the wiring conductor may be each formed by integrating a metal foil or a metal column with the insulating substrate made of the resin, or by forming a coating over the insulating substrate 2 with, e.g., the sputtering method, the vapor deposition method, or the plating method.

The cutout 3 extends up to a lower end of the insulating substrate 2, and a lower end portion of the inner surface of the cutout 3 protrudes toward the inner side of the cutout 3. The expression "a lower end portion of the inner surface of the cutout 3 protrudes toward the inner side of the cutout 3" implies that, as denoted by arrows of broken lines in a portion D of the electronic device illustrated in FIG. 1(a), the lower end portion of the inner surface of the cutout 3 protrudes in a direction toward a center of the cutout 3 when looking at the cutout 3 in the plan view.

Figure 6:
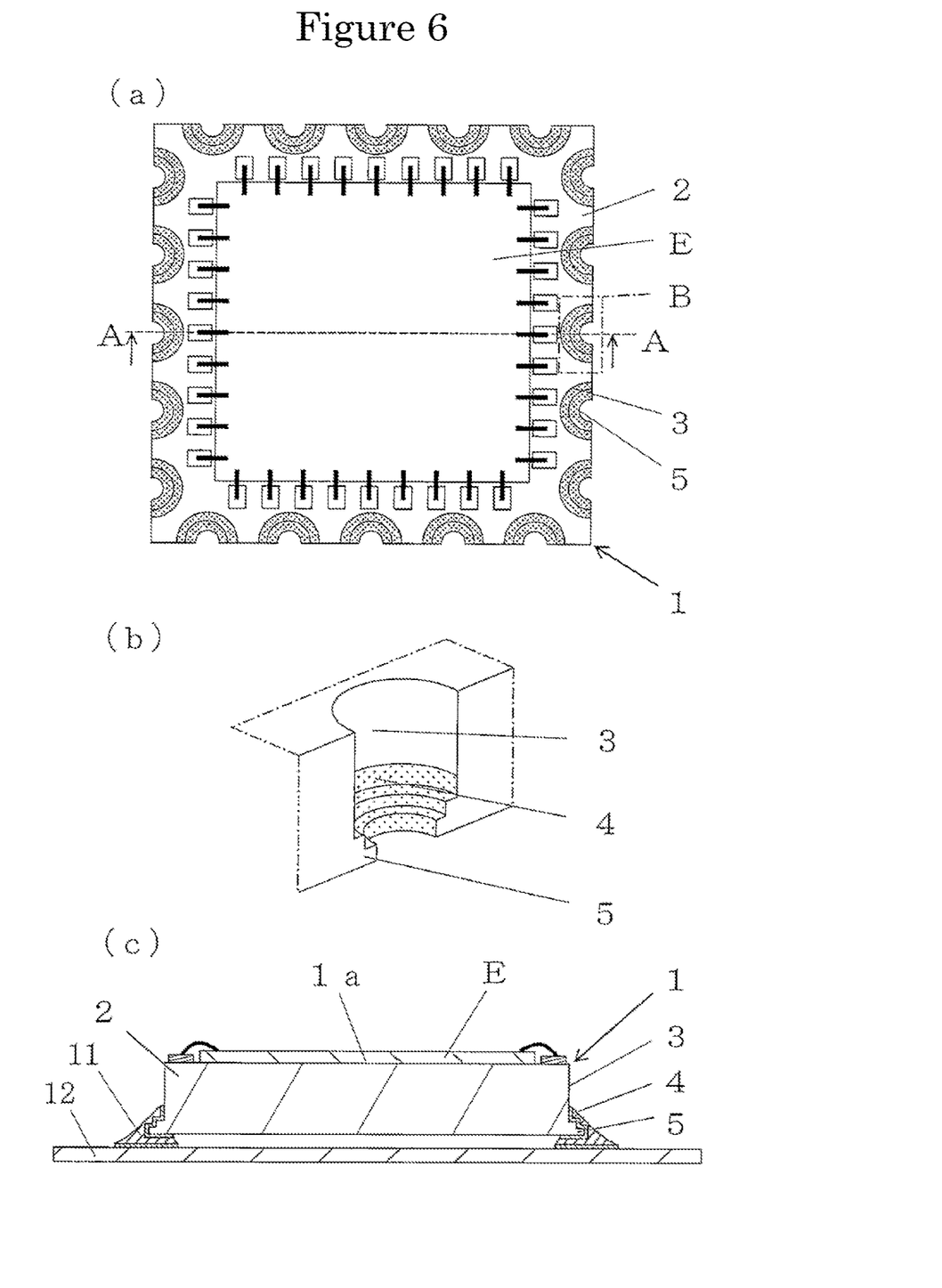

The external electrode 4 is denoted by dot patterns in (a) and (b) of each of FIGS. 1 to 3 and later-described FIGS. 4 and 6, and it is disposed in the region spanning from the inner surface of the cutout 3 to the lower surface of the insulating substrate 2. The external electrode 4 is electrically connected to an electrode pad, which is formed on the mount board 12, through a brazing material 11 such as a solder.

The electronic component E is mounted to the upper surface of the wiring substrate 1. The electronic component E is mounted by wire boding or by flip chip bonding. FIGS. 1 to 3 and later-described FIGS. 4 and 6 each illustrate a connection structure with the wire bonding.

The wiring substrate 1 of this embodiment includes the insulating substrate 2 having the lateral surface that includes the cutout 3, and the external electrode 4 over the region spanning from the inner surface of the cutout 3 to the lower surface of the insulating substrate 2. The cutout 3 extends up to the lower end of the insulating substrate 2, and the lower end portion of the inner surface of the cutout 3 protrudes toward the inner side of the cutout 3.

Because the lower end portion of the inner surface of the cutout 3 protrudes toward the inner side of the cutout 3 as described above, the brazing material 11 can easily stay inside the cutout 3 when the electronic device including the wiring substrate 1 is joined to the mount board 12 by employing the brazing material 11. Therefore, a large meniscus can be formed with the brazing material 11. Moreover, the brazing material 11 is disposed on an upper surface of a protruded portion of the inner surface of the cutout 3, and the strength of joining between the external electrode 4 constituting the wiring substrate 1 and the electrode pad formed on the mount board 12 is increased. Hence, the wiring substrate 1 according to one embodiment of the present invention can realize an electronic device having improved mounting reliability.

Figure 1:
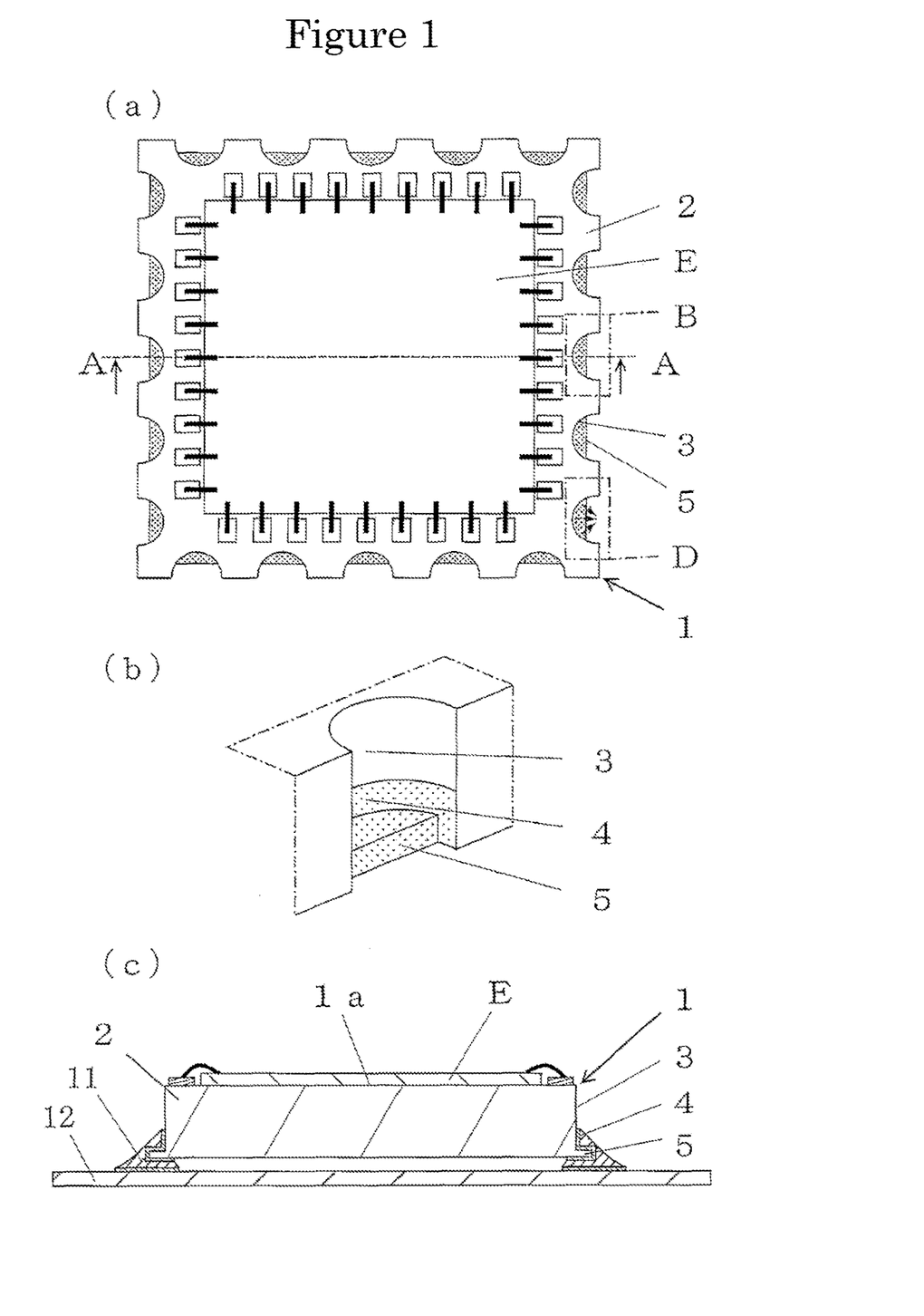
FIG. 1(a) is a top plan view of an electronic device according to a first embodiment of the present invention.
FIG. 1(b) is an enlarged perspective view of a portion B of the electronic device illustrated in FIG. 1(a)
FIG. 1(c) is a sectional view, taken along a section line A-A, of an electronic module in which the electronic device illustrated in FIG. 1(a) is joined to a mount board.
Figure 2:
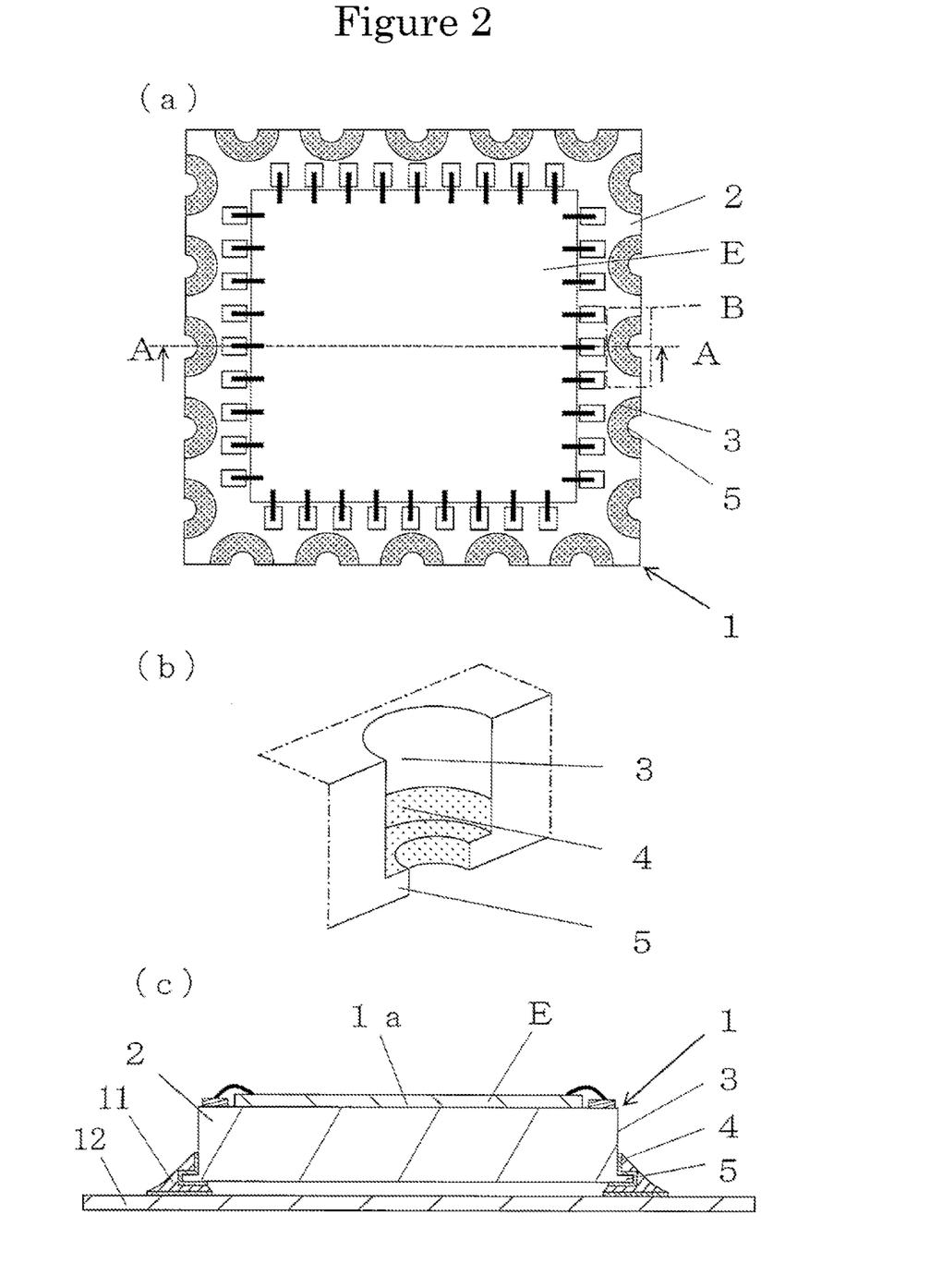
FIG. 2(a) is a top plan view of a modification of the electronic device according to the first embodiment of the present invention.
FIG. 2(b) is an enlarged perspective view of a portion B of the electronic device illustrated in FIG. 2(a)
FIG. 2(c) is a sectional view, taken along a section line A-A, of an electronic module in which the electronic device illustrated in FIG. 2(a) is joined to the mount board.

Furthermore, as illustrated in FIGS. 1 and 2 and later-described FIGS. 4 and 6, a lower surface of the protruded portion of the inner surface of the cutout 3 and the lower surface of the insulating substrate are positioned flush. Such an arrangement is preferable for the following reason. When the electronic device including the wiring substrate 1 is joined to the mount board 12 by employing the brazing material 11, the brazing material 11 is soon filled in a sufficient amount between the protruded portion of the inner surface of the cutout 3 and the mount board 12. As a result, a larger amount of the brazing material 11 stays on the upper surface of the protruded portion of the inner surface of the cutout 3, and the brazing material 11 can form a larger meniscus.

The above-mentioned structure in which the lower end portion of the inner surface of the cutout 3 protrudes toward the inner side of the cutout 3 can be formed, as illustrated in FIG. 1, such that a space is present between the protruded portion of the inner surface of the cutout 3 and an edge portion of the cutout 3 positioned at the lateral surface of the insulating substrate 2. Alternatively, as illustrated in FIG. 2, the lower end portion of the inner surface of the cutout 3 may protrude up to a location corresponding to the lateral surface of the insulating substrate 2 where the cutout 3 is not formed, and a through-hole may be formed in the protruded portion substantially in a concentric relation to the cutout 3. The latter case that the lower end portion of the inner surface of the cutout 3 protrudes up to the location corresponding to the lateral surface of the insulating substrate 2 where the cutout 3 is not formed and the through-hole is formed in the protruded portion substantially in a concentric relation to the cutout 3 is preferable for the following reason. Because the lower end portion of the inner surface of the cutout 3 protrudes up to the location corresponding to the lateral surface of the insulating substrate 2 where the cutout 3 is not formed, the protruded portion has a larger area, whereby the brazing material 11 can more easily stay inside the cutout 3 and the brazing material 11 can form an even larger meniscus. As a result, the strength of joining between the external electrode 4 constituting the wiring substrate 1 and the electrode pad formed on the mount board 12 is further increased.

Figure 3:
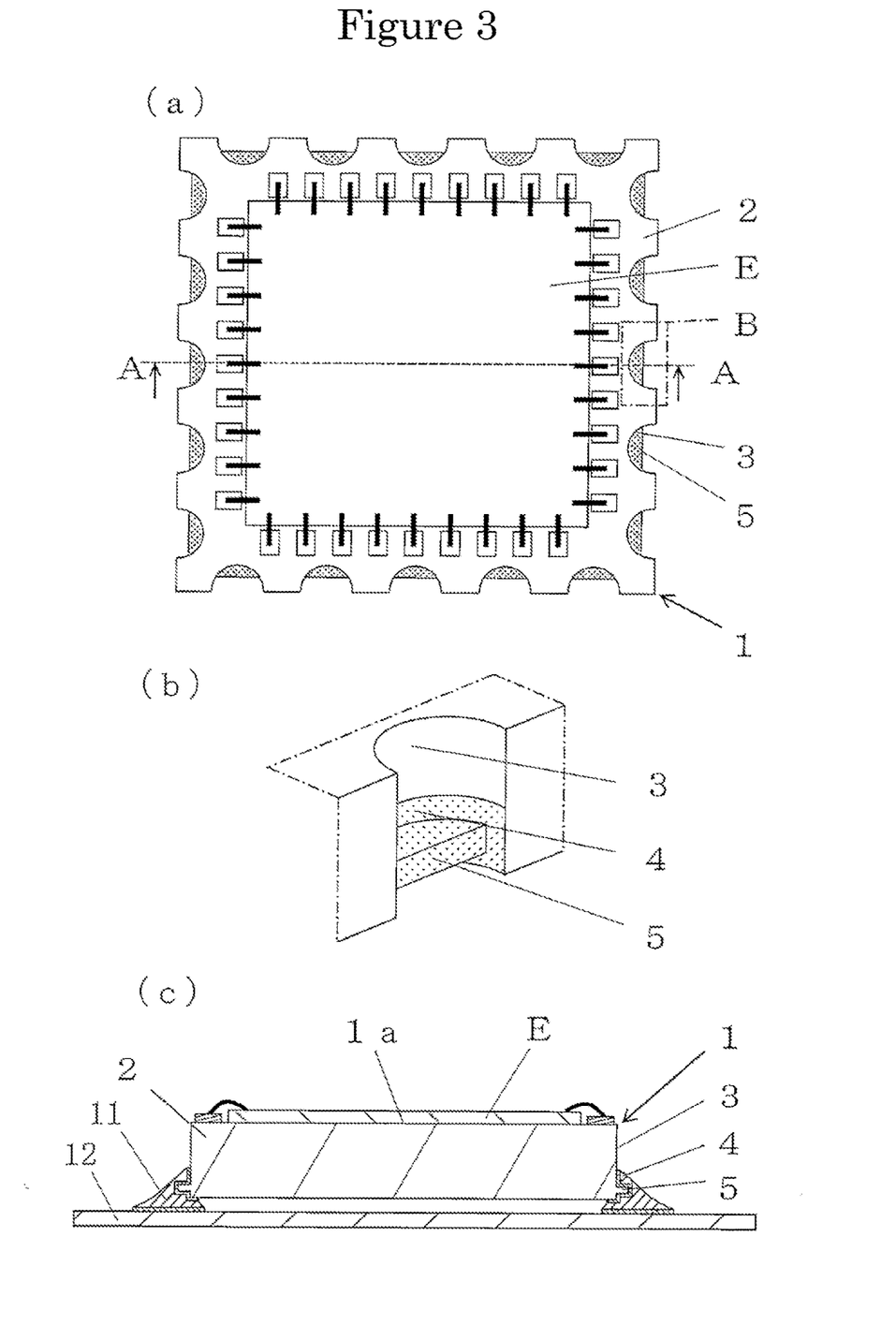
FIG. 3(a) is a top plan view of another modification of the electronic device according to the first embodiment of the present invention.
FIG. 3(b) is an enlarged perspective view of a portion B of the electronic device illustrated in FIG. 3(a)
FIG. 3(c) is a sectional view, taken along a section line A-A, of an electronic module in which the electronic device illustrated in FIG. 3(a) is joined to the mount board.
Figure 4:
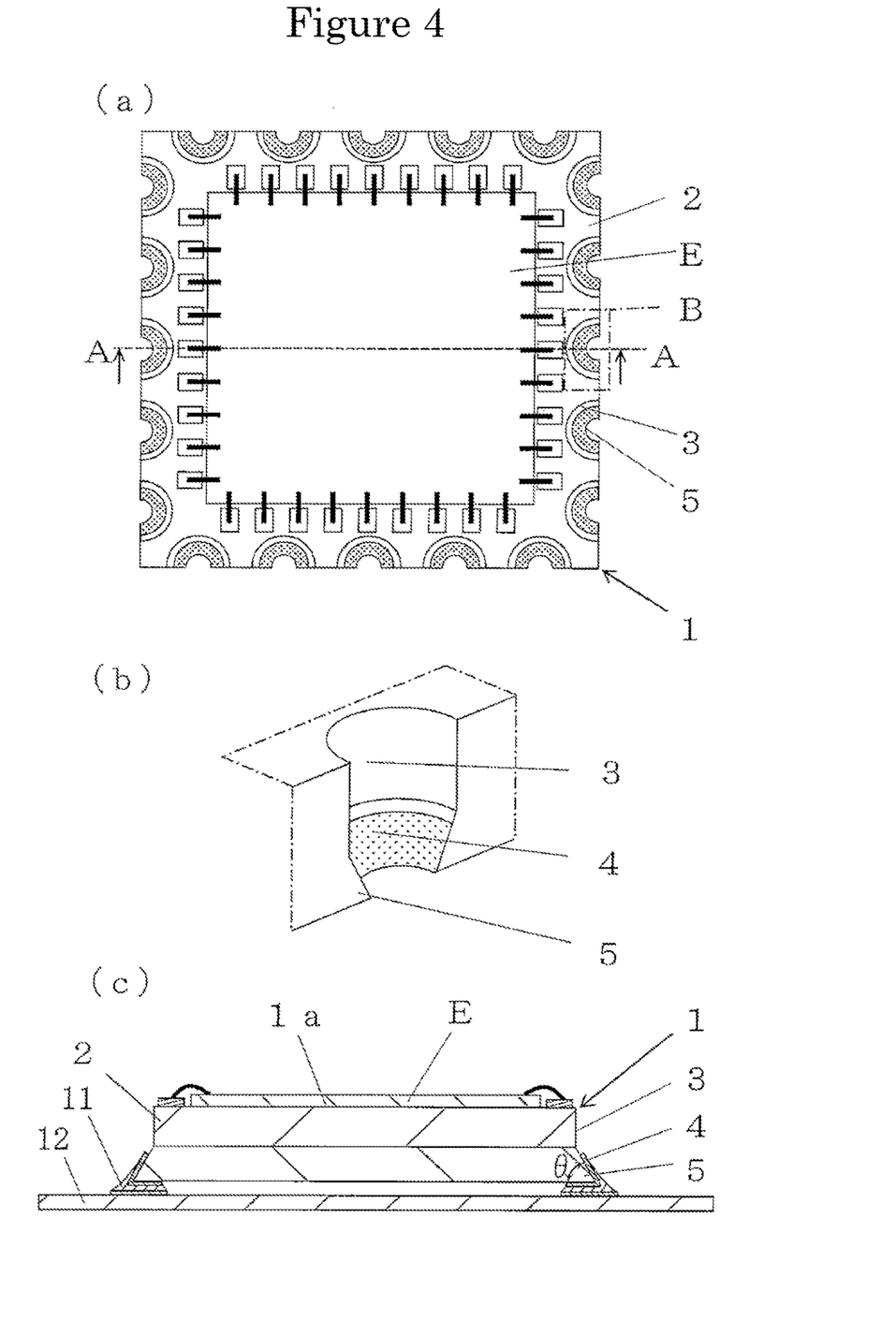
FIG. 4(a) is a top plan view of an electronic device according to a second embodiment of the present invention.
FIG. 4(b) is an enlarged perspective view of a portion B of the electronic device illustrated in FIG. 3(a)
FIG. 4(c) is a sectional view, taken along a section line A-A, of an electronic module in which the electronic device illustrated in FIG. 3(a) is joined to the mount board.

As illustrated in FIG. 3, a space may be present between the protruded portion of the inner surface of the cutout 3 and the lower end of the inner surface of the cutout 3. The structure that the space is present between the protruded portion of the inner surface of the cutout 3 and the lower end of the inner surface of the cutout 3 is preferable for the following reason. The brazing material 11 can easily stay in a larger amount under the protruded portion, and the strength of joining between the external electrode 4 constituting the wiring substrate 1 and the electrode pad formed on the mount board 12 is even further increased.

A method of manufacturing the wiring substrate 1 of this embodiment will be described below.

The insulating substrate 2 is made of an aluminum oxide ($Al_2O_3$)-base sintered compact, for example, and it includes, on the upper surface, the mounting portion 1a to which the electronic component E is mounted. When the insulating substrate 2 is made of the aluminum oxide ($Al_2O_3$)-base sintered compact that contains aluminum oxide ($Al_2O_3$) as a main component, slurry is prepared by adding powders of, e.g., silica ($SiO_2$), magnesia ($MgO$), calcia ($CaO$), as sintering aids, to powder of $Al_2O_3$, further adding an appropriate binder, solvent, and plasticizer, and then kneading the mixture. Thereafter, a ceramic green sheet from which many unit-size sheets can be obtained is formed by the known shaping method, e.g., the doctor blade method.

The wiring substrate 1 is fabricated through the following steps (1) to (5) by employing the ceramic green sheet obtained as described above.

(1) A punching step using a punching die including portions to form the cutout 3 and the protruded portion 5.

(2) A step of printing and coating the conductive paste to form not only the external electrode 4 that is disposed over the region spanning from the inner surface of the cutout 3, which is formed in the lateral surface of the insulating substrate 2, to the lower surface of the insulating substrate 2, but also the wiring conductor, including the penetration conductor such as the via hole conductor and the through-hole conductor, which extends from the upper surface of the insulating substrate 2 to which the electronic component E is mounted, to the external electrode 4 at the lateral surface of the insulating substrate 2.

(3) A step of stacking the ceramic green sheets each serving as an insulating layer, and fabricating a laminate of stacked ceramic green sheets.

(4) A step of cutting and separating the laminate of stacked ceramic green sheets into individual unit-size laminates each of which is used as the insulating substrate 2, and firing the unit-size laminate, thereby obtaining a sintered compact that includes the external electrode 4.

(5) A step of coating, over a surface of the external electrode 4, a metal plating layer that prevents oxidation for protection of the external electrode 4 and that facilitates the brazing.

Because the wiring substrate 1 of this embodiment can be fabricated in a large number at one lot, the wiring substrate 1 can be manufactured at a lower cost with higher versatility than a semiconductor package of the type in which a metal frame is disposed on a substrate made of a ceramic.

Here, a through-hole providing the protruded portion 5 in the ceramic green sheet may be formed by a method of punching the ceramic green sheet with a punching die that is partly cut out in a shape to provide the protruded portion 5 after the punching.

The method of coating the conductive paste over an inner surface of the through-hole, which defines the cutout 3, in the ceramic green sheet is not limited to printing, such as screen printing, and it can also be performed, for example, by coating the conductive paste over the inner surface of the cutout 3, which appears after cutting the laminate of stacked ceramic green sheets, with brush coating. However, the brush coating method is not practically suitable. Hence the external electrode 4 is preferably formed by a method of filling the conductive paste into the through-hole with screen printing, and then sucking an extra part of the conductive paste under appropriate pressure.

By firing each of the individual unit-size laminates cut out from the laminate of stacked ceramic green sheets, the external electrode 4 is also fired and formed as a coating. More specifically, the external electrode 4 on the inner surface of the cutout 3 is formed in thickness of 5 to 25 μm, and the wiring conductors for input/output terminals electrically connected to the electronic component E are further formed in thickness of 5 to 25 μm.

Moreover, in order to prevent oxidation for protection of the external electrode 4 and to allow the brazing to be easily and firmly performed on the external electrode 4, it is preferable to coat a Ni plating layer with thickness of 0.5 to 10 μm, or to successively coat that Ni plating layer and a gold (Au) plating layer with thickness of 0.5 to 2 μm, on the surface of the external electrode 4.

In the wiring substrate 1 of this embodiment, since the lower end portion of the inner surface of the cutout 3 protrudes toward the inner side of the cutout 3, the brazing material 11 can easily stay inside the cutout 3 when the electronic device including the wiring substrate 1 is joined to the mount board 12 by employing the brazing material 11. In addition, since the brazing material 11 is placed on the upper surface of the protruded portion of the inner surface of the cutout 3, the electronic device can be realized in which the mounting reliability of the wiring substrate 1 is improved.

In the electronic device according to this embodiment, the mounting reliability is improved because the electronic device includes the wiring substrate 1 constituted as described above.

In an electronic module according to this embodiment, since the electronic module includes the electronic device constituted as described above and the brazing material 11 is placed on the upper surface of the protruded portion of the inner surface of the cutout 3, the mounting reliability of the wiring substrate 1 is improved.

Second Embodiment

An electronic device according to a second embodiment of the present invention will be described below with reference to FIGS. 4 and 5. The electronic device of the second embodiment differs from the electronic device of the first embodiment in structure of the lower end portion of the inner surface of the cutout 3. The first embodiment has the structure in which, as illustrated in FIG. 1(*c*) by way of example, the lower end portion of the inner surface of the cutout 3 protrudes perpendicularly from the inner surface of the cutout 3 when viewed in a vertical sectional view. In contrast, the second embodiment has a structure in which the inner surface of the cutout protrudes such that an inner diameter of the cutout gradually reduces toward the lower end of the cutout.

In the electronic device of this embodiment, given that θ denotes an angle formed between the inner surface of the cutout 3 in the protruded portion 5 of the inner surface of the cutout 3 and the lower surface of the insulating substrate 2, 45 degrees≤θ≤70 degrees is preferably satisfied. When θ is set to 45 degrees or more, the thickness of the protruded portion 5 is not too thin, and damage, such as cracking or chipping, of the protruded portion 5 is less likely to occur due to external force applied when the wiring substrate 1 is handled. When θ is set to 70 degrees or less, the brazing material 11 is allowed to stay inside the cutout 3 when the electronic device including the wiring substrate 1 is joined to the mount board 12 by employing the brazing material 11. As a result, the strength of joining between the wiring substrate 1 and the mount board 12 can be ensured sufficiently. Moreover, by setting θ to fall in the above-mentioned range, the brazing material 11 can easily stay inside the cutout 3 and the brazing material 11 can form a sufficiently large meniscus when the electronic device including the wiring substrate 1 is joined to the mount board 12 by employing the brazing material 11. Hence greater joining strength is obtained.

A through-hole providing a protruded portion 5, which protrudes from the inner surface of the cutout 3 such that the inner diameter of the cutout 3 gradually reduces toward the lower end of the cutout 3, can be formed as follows. An inner wall of the through-hole formed in a ceramic green sheet 2*a* spreads at an angle of 45 to 70 degrees from one principal surface to the other one of the ceramic green sheet 2*a*. Thus, by forming the inner wall of the through-hole in a shape spreading at the angle θ of 45 to 70 degrees from one principal surface to the other one of the ceramic green sheet 2*a*, the inner wall of the through-hole can be formed such that the inner wall spreads outwardly at the angle θ of 45 to 70 degrees relative to the lower surface of the insulating substrate 2.

Figure 5:
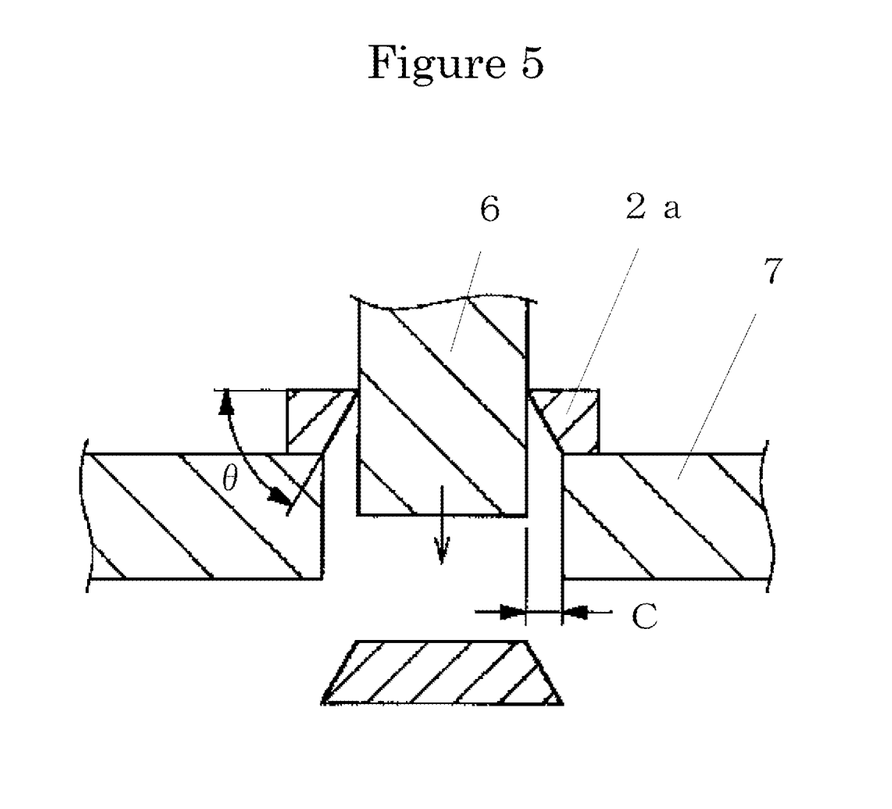
FIG. 5 is a sectional view illustrating a manner of punching a ceramic green sheet in a manufacturing method for a wiring substrate according to the second embodiment of the present invention.

The above-mentioned structure in which the inner wall of the through-hole in the ceramic green sheet 2*a* spreads at the angle θ of 45 to 70 degrees from one principal surface to the other one of the ceramic green sheet 2*a* can be obtained by setting a clearance C between a punch 6 and a die 7 of a punching die unit to be relatively large as illustrated in FIG. 5 that a sectional view to explain a manner of forming the through-hole by punching. When the thickness of the ceramic green sheet 2*a* is about 0.5 mm, for example, the clearance C in the die unit needs to be set to about 0.2 to 0.5 mm. Under that setting, the angle θ of 45 to 70 degrees can be obtained. If the angle θ is less than 45 degrees, it would be usually difficult to form the inner wall of the through hole at the angle θ in the above-mentioned range with stability and high efficiency.

In the wiring substrate 1 of this embodiment, since the inner surface of the cutout 3 protrudes such that the inner diameter of the cutout 3 gradually reduces toward the lower end of the cutout 3, the brazing material 11 can easily stay inside the cutout 3 and the brazing material 11 can easily form a sufficiently large meniscus when the electronic device including the wiring substrate 1 is joined to the mount board 12 by employing the brazing material 11. Thus, since the brazing material 11 is attached to an inclined surface and is placed on the upper surface of the protruded portion 5 of the inner surface of the cutout 3, greater joining strength can be obtained.

In the electronic device according to this embodiment, the mounting reliability is improved because the electronic device includes the wiring substrate 1 constituted as described above.

In an electronic module according to this embodiment, since the electronic module includes the electronic device constituted as described above and the brazing material 11 is placed on the upper surface of the protruded portion of the inner surface of the cutout 3, the mounting reliability of the wiring substrate 1 is improved.

Third Embodiment

An electronic device according to a third embodiment of the present invention will be described below with reference to FIG. 6. The electronic device of the third embodiment differs from the electronic devices of the first and second embodiments in structure of the lower end portion of the inner surface of the cutout 3. The third embodiment has a structure in which the inner surface of the cutout protrudes such that the inner diameter of the cutout reduces in a stepwise manner toward the lower end of the cutout.

A through-hole providing a protruded portion 5, which protrudes from the inner surface of the cutout 3 such that the inner diameter of the cutout 3 reduces in a stepwise manner toward the lower end of the cutout 3, is formed in a stepped shape with the inner diameter of the cutout 3 reducing in a stepwise manner toward the lower end of the cutout 3, as illustrated in FIG. 5.

The through-hole providing the protruded portion 5, which protrudes from the inner surface of the cutout 3 such that the inner diameter of the cutout 3 reduces in a stepwise manner toward the lower end of the cutout 3, can be formed as follows. Ceramic green sheets including through-holes formed in different inner diameters are prepared and stacked in a structure in which the inner diameters of the through-holes defining the cutout 3 reduce in a stepwise manner toward the lowermost one of the through-holes defining the cutout 3. Thus, by preparing the ceramic green sheets including the through-holes formed in different inner diameters and by stacking the ceramic green sheets in the structure in which the inner diameters of the through-holes defining the cutout 3 reduce in a stepwise manner toward the lowermost one of the through-holes defining the cutout 3, the cutout 3 can be formed in a shape having the inner diameter that reduces in a stepwise manner toward the lower end of the cutout 3.

In the wiring substrate 1 of this embodiment, since the inner surface of the cutout 3 protrudes such that the inner diameter of the cutout 3 reduces in a stepwise manner toward the lower end of the cutout 3, stronger joining can be realized with the stepwise uneven inner surface of the cutout 3, the brazing material 11 can easily stay inside the cutout 3, and the brazing material 11 can easily form a sufficiently large meniscus when the electronic device including the wiring substrate 1 is joined to the mount board 12 by employing the brazing material 11. Moreover, since the brazing material 11 is placed on the upper surface of the protruded portion 5 of the inner surface of the cutout 3, greater joining strength can be obtained.

In the electronic device according to this embodiment, the mounting reliability is improved because the electronic device includes the wiring substrate 1 constituted as described above.

In an electronic module according to this embodiment, since the electronic module includes the electronic device constituted as described above and the brazing material 11 is placed on the upper surface of the protruded portion of the inner surface of the cutout 3, the mounting reliability of the wiring substrate 1 is improved.

REFERENCE SIGNS LIST

1 . . . wiring substrate
1a . . . mounting portion
2 . . . insulating substrate
3 . . . cutout
4 . . . external electrode
5 . . . protruded portion
11 . . . brazing material
12 . . . mount board

What is claimed is:

1. A wiring substrate comprising:
an insulating substrate having a lateral surface including a cutout, the cutout extending from a top surface of the insulating substrate to a lower surface of the insulating substrate; and
an external electrode extending from an inner surface of the cutout to the lower surface of the insulating substrate, and from the lower surface of the insulating substrate to below the top surface of the insulating substrate,
wherein the insulating substrate includes a protrusion at a lower end portion of the inner surface of the cutout,
the protrusion protrudes from the inner surface of the cutout toward the lateral surface of the insulating substrate, and
the external electrode includes a protruding portion disposed on a surface of the protrusion, the protruding portion extending a first distance from an inner surface of the cutout toward the lateral surface of the insulating substrate to an edge surface of the external electrode, the first distance being at least half of a second distance which extends from the inner surface of the cutout to a plane that includes an outer surface of the insulating substrate.

2. The wiring substrate according to claim 1, wherein a lower surface of the protrusion is flush with the lower surface of the insulating substrate.

3. The wiring substrate according to claim 1, wherein a lower surface of the protrusion is located above the lower surface of the insulating substrate.

4. The wiring substrate according to claim 1, wherein an inner diameter of the protrusion gradually reduces along with approach to the lower surface of the insulating substrate.

5. The wiring substrate according to claim 1, wherein an inner diameter of the protrusion reduces in a stepwise manner along with approach to the lower surface of the insulating substrate.

6. An electronic device comprising:
the wiring substrate according to claim 1; and
an electronic component mounted to the wiring substrate.

7. An electronic module comprising:
the electronic device according to claim 6; and
a mount board to which the electronic device is joined with a brazing material,
wherein the brazing material is placed on an upper surface of the protrusion.

8. The wiring substrate according to claim 1, wherein the first distance extends in a line perpendicular to the plane which includes the outer surface of the insulating substrate.

9. The wiring substrate according to claim 1, wherein the edge surface of the protruding part of the external electrode is coplanar with the outer edge of the lateral surface of the insulating substrate.

* * * * *